United States Patent
Chuang

(10) Patent No.: US 8,330,091 B2
(45) Date of Patent: Dec. 11, 2012

(54) IMAGE SENSOR FORMED BY SILICON RICH OXIDE MATERIAL

(75) Inventor: Ming-Hung Chuang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 472 days.

(21) Appl. No.: 12/561,277

(22) Filed: Sep. 17, 2009

(65) Prior Publication Data

US 2011/0012009 A1 Jan. 20, 2011

(30) Foreign Application Priority Data

Jul. 16, 2009 (TW) ................................. 98124077 A

(51) Int. Cl.
*H01J 40/14* (2006.01)
*H01L 27/00* (2006.01)
(52) U.S. Cl. ................................. 250/214 R; 250/208.1
(58) Field of Classification Search ............... 250/208.1, 250/214 R, 21.1, 214 SW, 214 A; 348/294, 348/300–302, 308, 310; 330/308; 257/414, 257/428, 432, 443
See application file for complete search history.

(56) References Cited

U.S. PATENT DOCUMENTS

| 6,921,891 | B2 * | 7/2005 | Seitz ......................... 250/214 R |
| 2006/0027733 | A1 | 2/2006 | Terzioglu |
| 2008/0036888 | A1 * | 2/2008 | Sugawa et al. ................ 348/294 |
| 2010/0231562 | A1 * | 9/2010 | Brown ........................... 345/207 |

* cited by examiner

*Primary Examiner* — Pascal M Bui Pho
(74) *Attorney, Agent, or Firm* — Winston Hsu; Scott Margo

(57) ABSTRACT

An image sensor includes a light-sensing element, a first transistor, and a second transistor. The light-sensing element has a first end and a second end electrically connected to a select line. The first transistor has a first end electrically connected to a first control line, a control end electrically connected to the first end, and a second end electrically connected to the first end of the light-sensing element. The second transistor has a first end electrically connected to a voltage source, a control end electrically connected to the first end of the light-sensing element, and a second end electrically connected to an output line. The light-sensing element uses the material of silicon rich oxide so that the light-sensing element can sense the luminance variance and have the characteristic of the capacitor for the level boost.

5 Claims, 5 Drawing Sheets

IMAGE SENSOR FORMED BY SILICON RICH OXIDE MATERIAL

BACKGROUND OF THE INVENTION

1. Field of the Invention

The present invention is related to an image sensor, and more particularly, to an image sensor formed by the silicon rich oxide material.

2. Description of the Prior Art

The conventional image sensor utilizes the built-in amplifier component of each pixel to amplify the photoelectric conversion signal. Each pixel then utilizes the XY addressing method to select for obtaining the voltage level of the photoelectric conversion signal. Since each pixel includes the built-in amplifier component, the photoelectric component (i.e. the light sensing component) generates the sensing signal of photo charges when beamed with light, and the sensing signal is amplified by the built-in amplifier component accordingly. This way, the sensing signal is not easily affected by the noise when being transmitted from the photoelectric component to the external control circuit. From the circuit design's point of view, the sensitivity of the image sensor is dependent on three main factors. The first factor is the area of the light sensing component. Fundamentally, the area of the light sensing component is directly proportional to the intensity of the sensed photo charges under identical luminance; increasing the area of the light sensing component increases the photo charges generated by the light sensing component. The second factor is the capacitance of the integrating capacitor. Theoretically, under the same stored electrical charge, the voltage at the two ends of the capacitor is inversely proportional to the capacitance; increasing the capacitance decreases the voltage at the two ends of the capacitor. The third factor is the gain of the sensing amplifier of the light sensing component.

SUMMARY OF THE INVENTION

The present invention discloses an image sensor. The image sensor comprises a light sensing component, a first transistor and a second transistor. The light sensing component has a first end, and a second. The second end is electrically connected to a select line. The first transistor has a first end electrically connected to a first control line, a control end electrically connected to the first end, and a second end electrically connected to the first end of the light sensing component. The second transistor has a first end electrically connected to a voltage source, a control end electrically connected to the first end of the light sensing component, and a second end electrically connected to an output line.

The present invention further discloses an image sensor. The image sensor comprises a light sensing component, a diode and a source follower. The light sensing component has a first end, and a second end electrically connected to a select line. The diode has a first end electrically connected to a control line, and a second end electrically connected to the first end of the light sensing component. The source follower has an input end electrically connected to the first end of the light sensing component, and an output end electrically connected to an output line, for outputting a sensing voltage generated by the light sensing component.

The present invention further discloses a method for detecting the luminance variation by using an image sensor, the image sensor comprising a light sensing component having a first end and a second end electrically connected to a select line; a first transistor having a first end electrically connected to a control line, a control end electrically connected to the first end and a second end electrically connected to the first end of the light sensing component; and a second transistor having a first end electrically connected to a voltage source, a control end electrically connected to the first end of the light sensing component and a second end electrically connected to an output line. The method comprises the control line transmitting a high level voltage to turn on the first transistor, for resetting a voltage level of the light sensing component; the control line transmitting a low level voltage to turn off the first transistor, for the light sensing component to generate a voltage drop when sensing light; and the select line transmitting the high level voltage for transmitting the voltage drop to the output line via the second transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
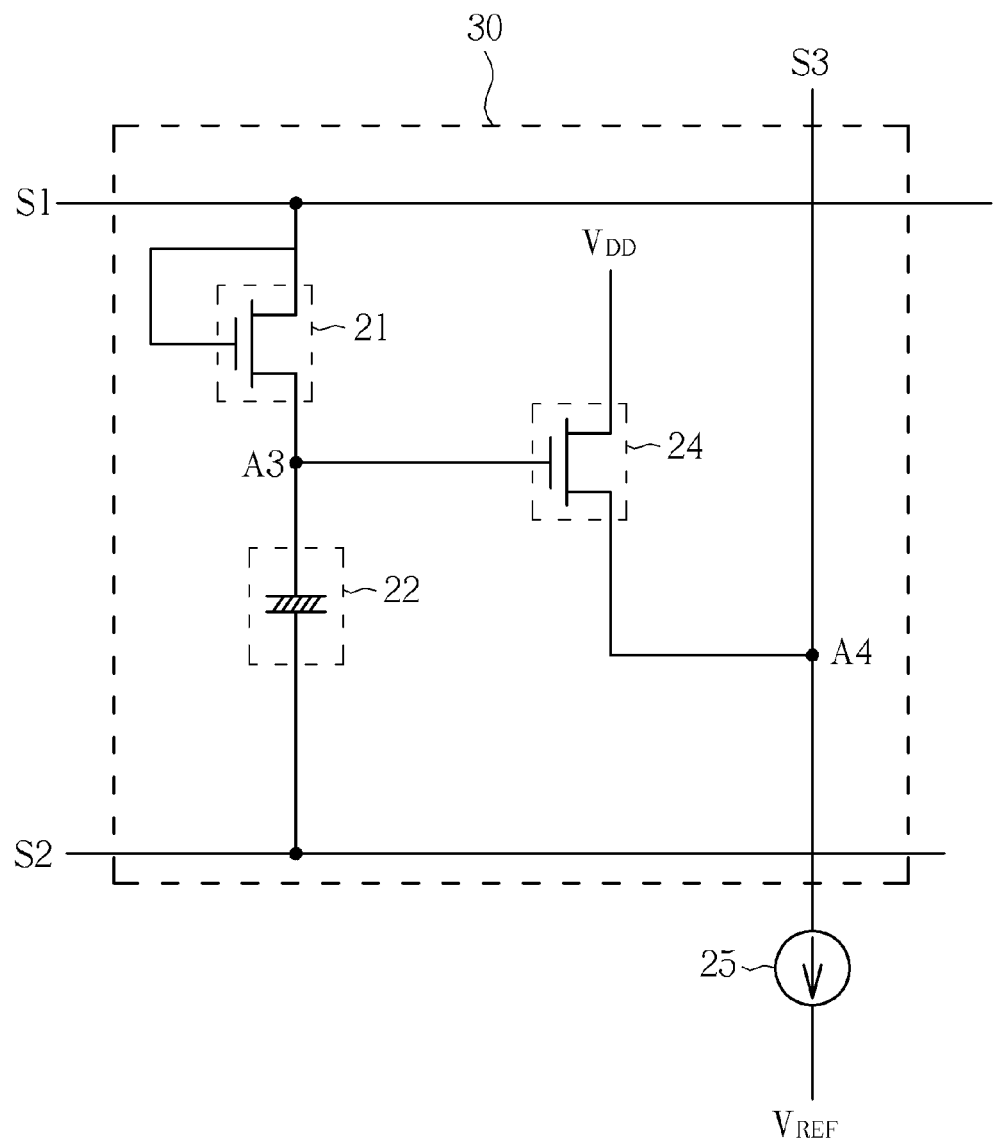
FIG. 1 is a circuit diagram illustrating the image sensor according to the first embodiment of the present invention.

Please refer to FIG. 1. FIG. 1 is a circuit diagram illustrating the image sensor 30 according to the first embodiment of the present invention. The light sensor 30 comprises a first transistor 21, a light sensing component 22, a second transistor 24 and a reference current source 25. In the present invention, the light sensing component 22 can be realized with a capacitor formed by a metal layer, a silicon rich oxide layer and a transparent metal layer, wherein the transparent metal layer can be made of Indium Tin Oxide (ITO). One end of the light sensing component 22 is electrically connected to the row select line S2 and the other end of the light sensing component 22 is electrically connected to the source electrode of the first transistor 21 and the gate electrode of the second transistor 24. The gate electrode and the source electrode of the first transistor 21 are electrically connected to form a diode component which is controlled by the reset signal line S1. The drain electrode of the second transistor 24 is electrically connected to the voltage source VDD; the gate electrode of the second transistor 24 is electrically connected to the light sensing component 22 and the source electrode of the transistor 21, forming a source follower which functions as the capacitance-voltage amplifier; the source electrode of the second transistor 24 is electrically connected to the column output line S3. The reference current source 25 is electrically connected to the column output line S3, the reference current source 25 provides the output current according to a reference voltage VREF.

Figure 2:
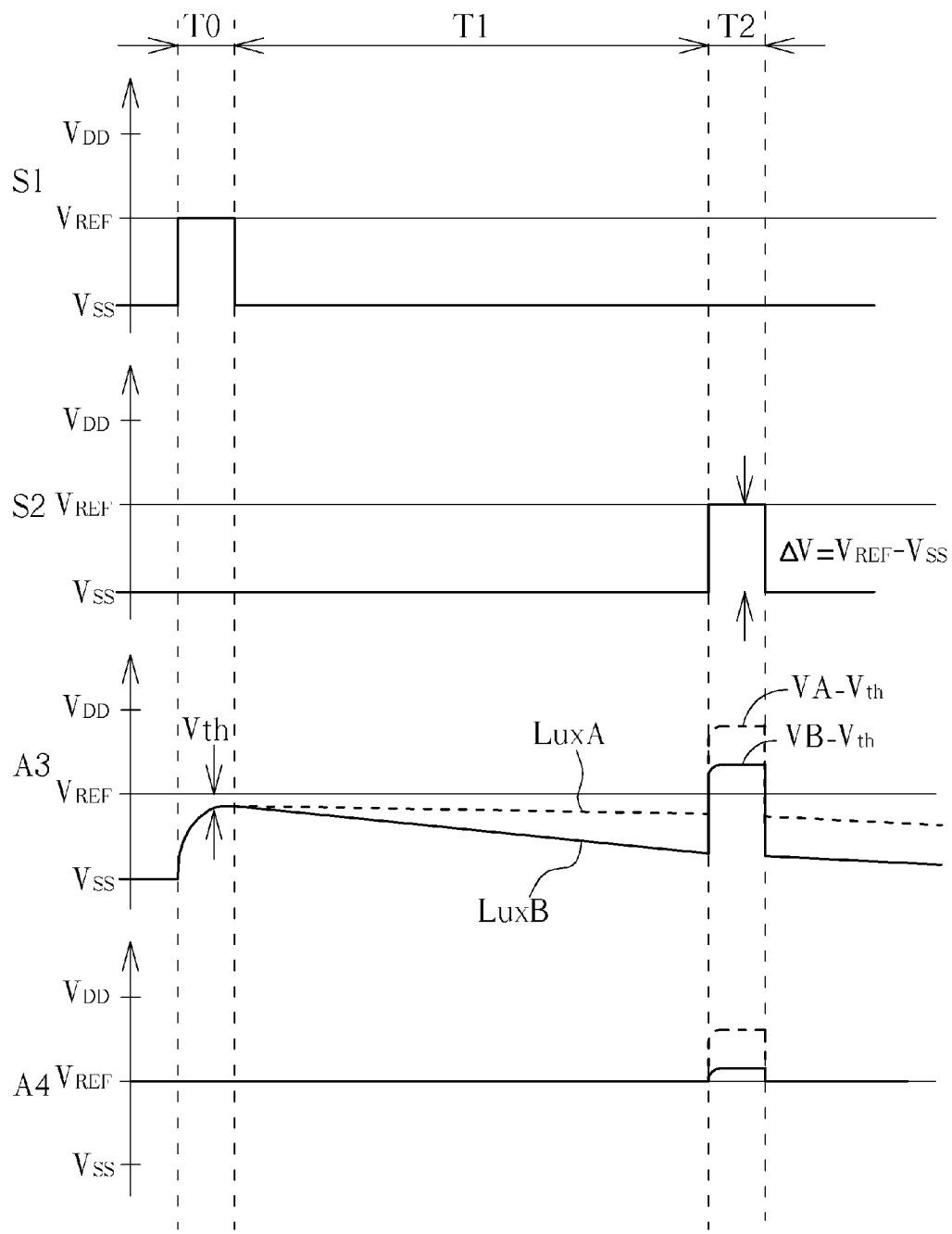
FIG. 2 is a waveform diagram illustrating the operation sequence of the image sensor of the present invention.

Please refer to FIG. 2. FIG. 2 is a waveform diagram illustrating the operation sequence of the image sensor 30 of the present invention. The operation sequence of the image sensor 30 can be roughly categorized into the reset phase T0, the integration phase T1 and the reading phase T2. The operation sequence of the image sensor 30 is explained as below:

Step 1: When the reset signal S1 is at the low voltage level (VSS), the voltage level of the node A3 of the light sensing component 22 is floating. When the reset signal S1 is converted from the low voltage level (VSS) to the high voltage level (VREF), the image sensor 30 enters the reset phase T0, and the diode component formed by the first transistor 21 is turned on due to the component operating in forward bias. When the reset signal line S1 is at the high voltage level (VREF), the node A3 of the light sensing component 22 is charged to the voltage level of (VREF−Vth) since the diode component is operating in forward bias, wherein Vth represents the threshold voltage of the first transistor 21.

Step 2: When the reset signal S1 is converted from the high voltage level (VREF) to the low voltage level (VSS), the diode component formed by the first transistor 21 is turned off due to the component operating in reverse bias. At the moment the voltage drop between the two ends of the light sensing component 22 is (VREF−Vth)−VSS, and the voltage level of the node A3 of the light sensing component 22 is floating; the image sensor 30 enters the integration phase T1.

Step 3: when the image sensor 30 is in the integration phase T1, the voltage level of the node A3 of the light sensing component 22 varies according to the luminance of the incident light. When the light sensing component 22 is beamed with light, the node A3 of the light sensing component 22 generates photo charges. The generated photo charges neutralize the stored charges of the node A3 of the light sensing component 22, diminishing the voltage drop between the two ends of the light sensing component 22. The higher the luminance of the incident light, the lower the voltage level of the node A3 of the light sensing component 22. For instances, when the light luminance B is greater than the light luminance A (i.e. Lux B>Lux A), the gradient of the decreasing rate of the voltage level of the node A3 for the light luminance A is also greater than that of the light luminance B (i.e. mB>mA)

Step 4: Since the diode component of the first transistor 21 is turned off due to the component operating in reverse bias, the voltage level of the node A3 of the light sensing component 22 is still floating. When the row select line S2 is converted from the low voltage level (VSS) to the high voltage level (VREF), the voltage level of the node A3 increases by (VREF−VSS) accordingly, as the voltage drop between the two ends of the light sensing component 22 (with characteristics of a capacitor) does not change instantaneously.

Step 5: When the voltage level of the node A3 of the light sensing component 22 has increased by (VREF−VSS) due to the light sensing component 22 with the characteristics of the capacitor, the voltage level of the node A3 is sufficient to turn on the second transistor 24 of the source follower.

Step 6: When the second transistor 24 of the source follower is turned on, the signal (equivalent to the voltage level of the node A4) of the column output line S3 is equivalent to the increased voltage level of the node A3 of the light sensing component 22 subtracting the threshold voltage Vth of the second transistor 24. For instances, the signal of the column output line S3 is (VA−Vth) for the light luminance Lux A and (VB−Vth) for the light luminance Lux B.

Figure 3:
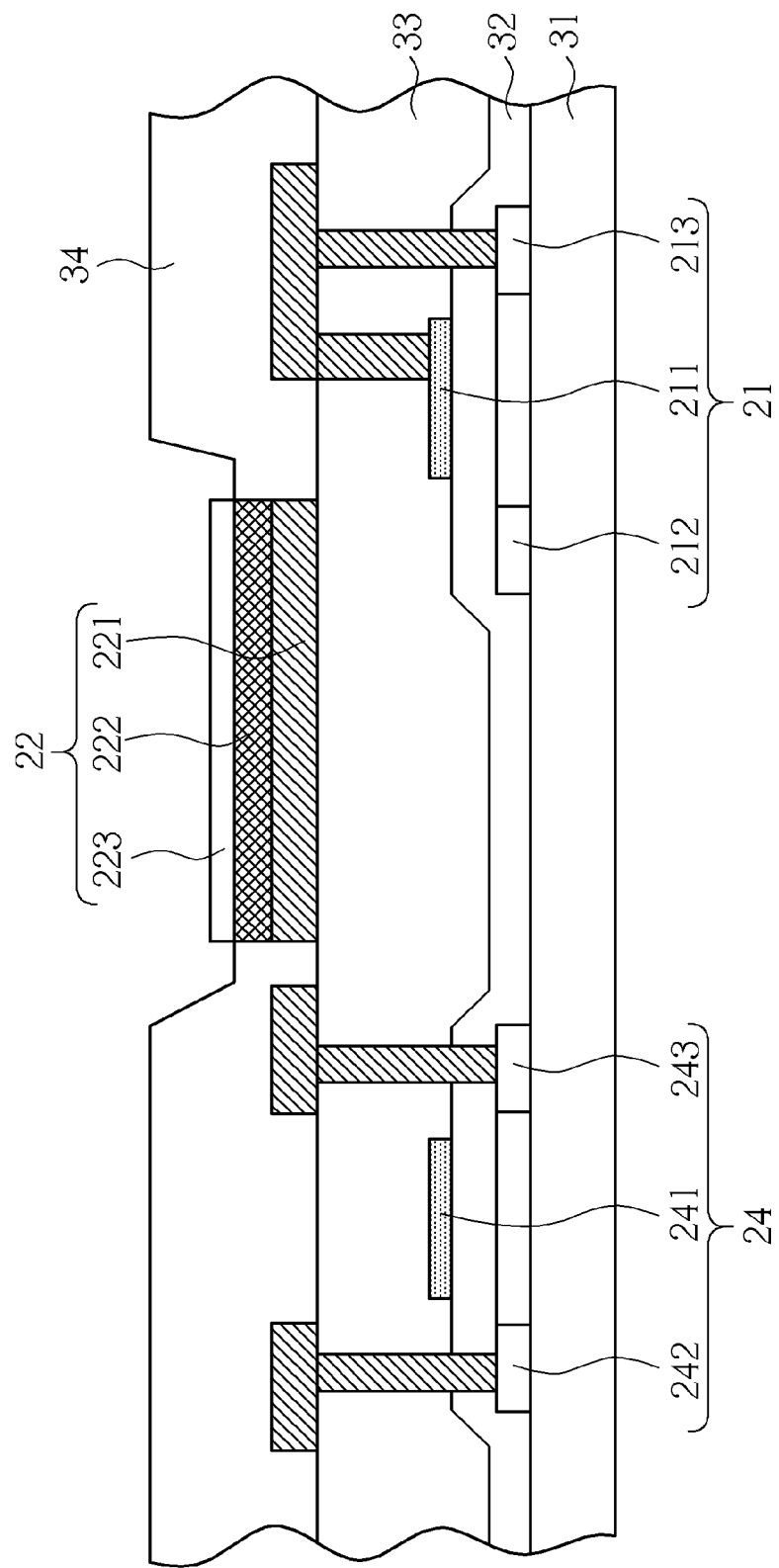
FIG. 3 is a diagram illustrating the cross-section view of the image sensor of the present invention.

Please refer to FIG. 3. FIG. 3 is a diagram illustrating the cross-section view of the image sensor 30 of the present invention. A first transistor 21 and a second transistor 24 are formed on the substrate 31. A gate oxide layer 32, a first insulation layer 33 and a second insulation layer 34 are formed between the first transistor 21, the second transistor 24 and the light sensing component 22. The first transistor 21 is an N-type Metal Oxide Semiconductor (NMOS) transistor, comprises a gate electrode 211, a source electrode 212 and a drain electrode 213. The second transistor 24 is an NMOS transistor, comprises a gate electrode 241, a source electrode 242 and a drain electrode 243. The light sensing component 22 comprises a metal layer 221, a silicon rich oxide layer 222 and a transparent metal layer 223.

Figure 4:
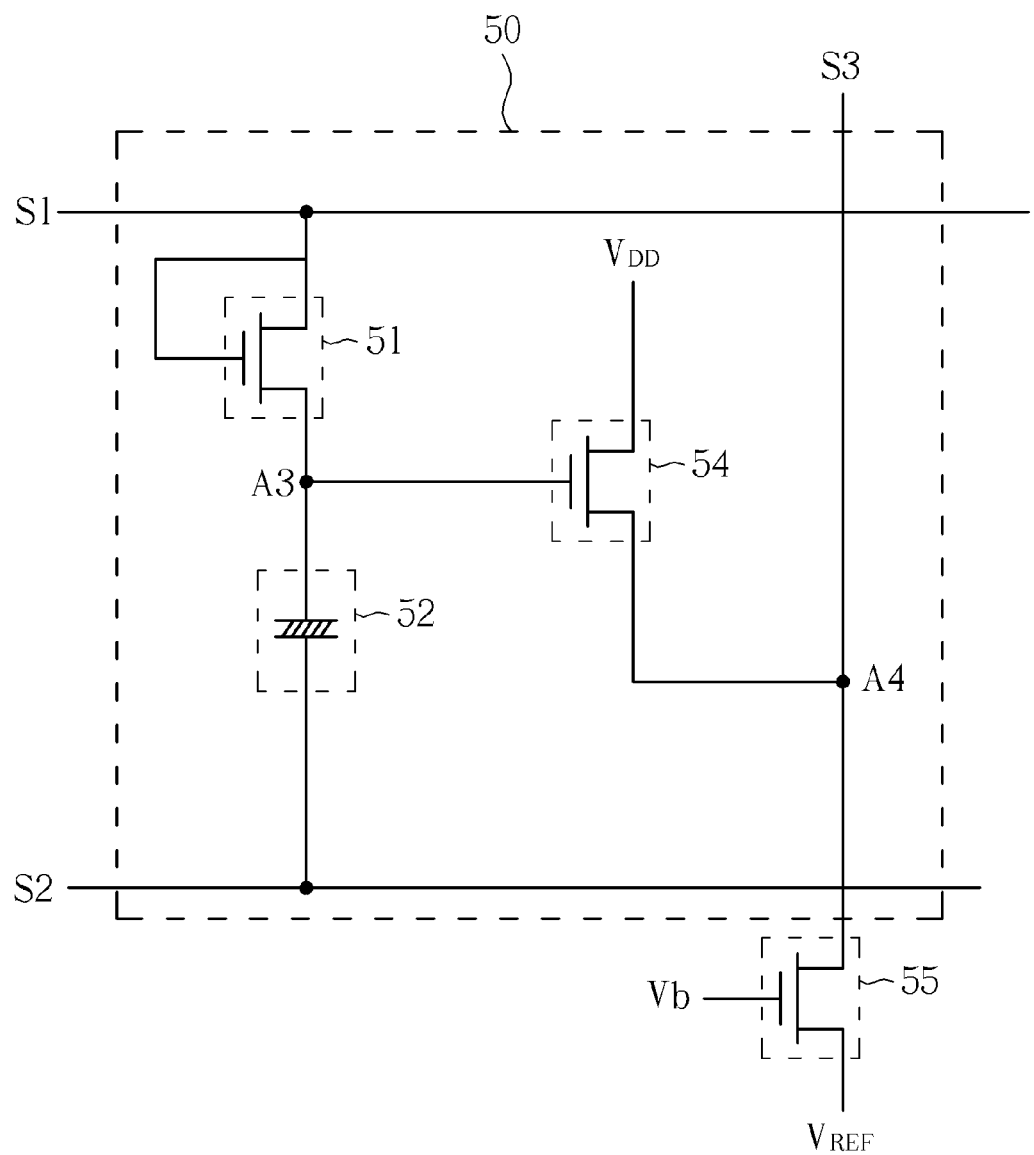
FIG. 4 is a diagram illustrating the image sensor according to the second embodiment of the present invention.

Please refer to FIG. 4. FIG. 4 is a diagram illustrating the image sensor 50 according to the second embodiment of the present invention. The image sensor comprises a first transistor 51, a light sensing component 52, a second transistor 54 and a third transistor 55. In the second embodiment, the third transistor 55 is utilized to replace the reference current source 25. The row output line S3 is electrically connected to the drain electrode of the third transistor 55; the gate electrode of the third transistor 55 is controlled by the signal line Vb; the source electrode of the third transistor 55 is electrically connected to the reference voltage source VREF.

Figure 5:
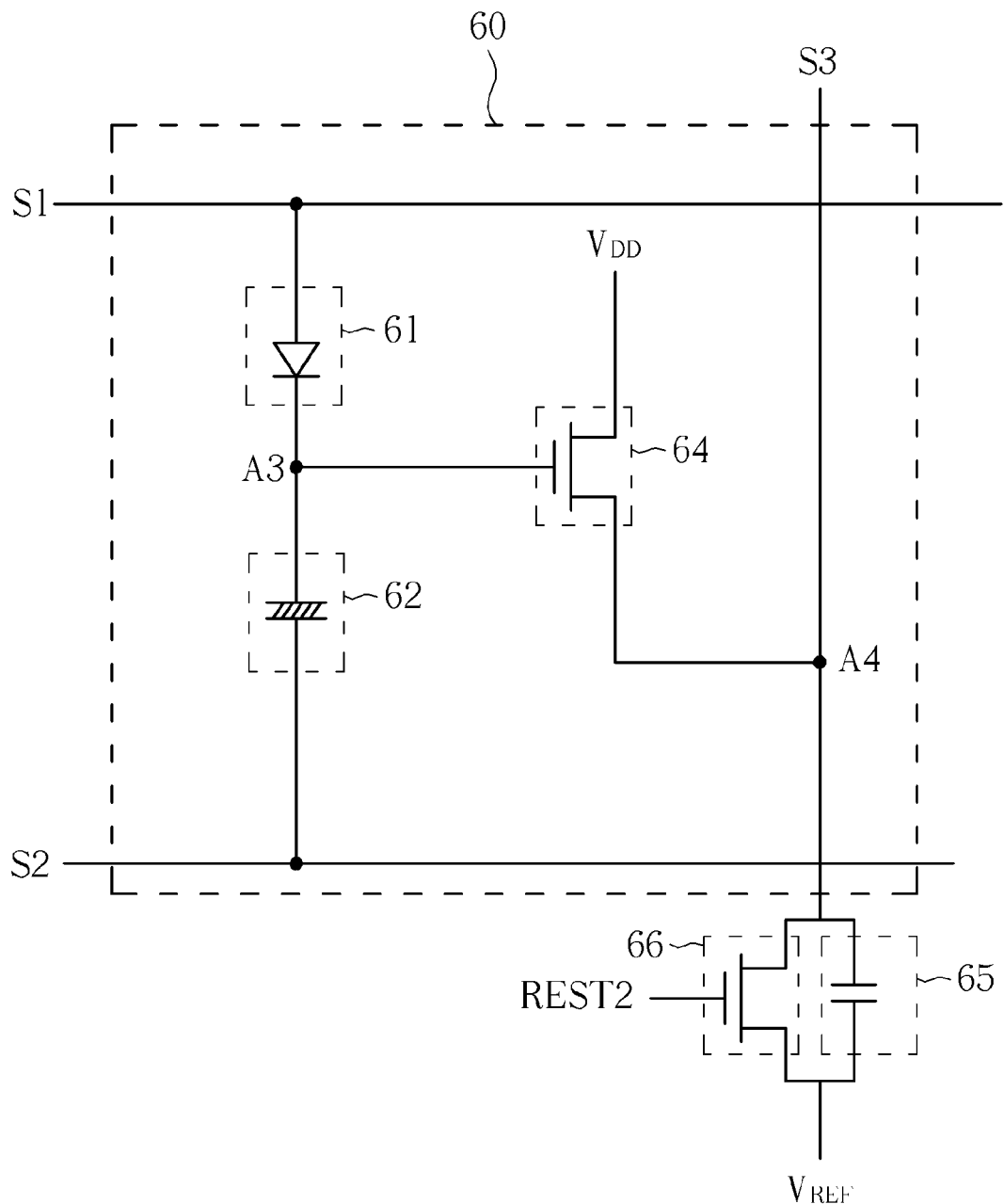
FIG. 5 is a diagram illustrating the image sensor according to the third embodiment of the present invention.

Please refer to FIG. 5. FIG. 5 is a diagram illustrating the image sensor 60 according to the third embodiment of the present invention. The image sensor 60 comprises a diode 61, a light sensing component 62, a second transistor 64, a sampling capacitor 65 and a third transistor 66. In the third embodiment, the sampling capacitor 65 and the third transistor 66 are utilized to replace the reference current source 25. In addition, the diode 61 also replaces the first transistor 21. The row output line S3 is electrically connected to the drain electrode of the third transistor 65 and one end of the sampling capacitor 65; the gate electrode of the third transistor 65 is controlled by the signal line REST2; the source electrode of the third transistor 65 is electrically connected to the other end of the sampling capacitor 65 and the reference voltage source VREF.

In conclusion, the image sensor of the present invention comprises a light sensing component, a first transistor and a second transistor. The light sensing component comprises a first end and a second end electrically connected to a select line. The first transistor comprises a first end electrically connected to a first control line, a control end electrically connected to the first end, and a second end electrically connected to the first end of the light sensing component. The second transistor comprises a first end electrically connected to a voltage source, a control end electrically connected to the first end of the light sensing component, and a second end electrically connected to an output line. The light sensing component is made of silicon rich oxide material, so the light sensing component is able to detect the variation of the light luminance. At the same time, the light sensing component possesses the characteristics of the integrating capacitor, and can be utilized for increasing the corresponding voltage level. Therefore, the image sensor of the present invention utilizes two transistors and the light sensing component made of the silicon rich oxide material, for simplifying the circuit structure.

Those skilled in the art will readily observe that numerous modifications and alterations of the device and method may be made while retaining the teachings of the invention.

What is claimed is:

1. An image sensor, comprising:
   a light sensing component, having a first end, and a second end electrically connected to a select line;
   a diode having a first end electrically connected to a first control line, and a second end electrically connected to the first end of the light sensing component;
   a source follower, having an input end electrically connected to the first end of the light sensing component, and an output end electrically connected to an output line, for outputting a sensing voltage generated by the light sensing component; and
   a current source, comprising:

a transistor having a first end electrically connected to the output line, a control end electrically connected to a second control line, and a second end electrically connected to a reference voltage source; and a capacitor having a first end electrically connected to the output line and a second end electrically connected to the reference voltage source.

2. The image sensor of claim 1, further comprising:
a voltage source, electrically connected to the source follower.

3. The image sensor of claim 2, wherein the source follower comprises:
a transistor, having a drain electrode electrically connected to the voltage source, a gate electrode electrically connected to the first end of the light sensing component, and a source electrode electrically connected to the output line.

4. The image sensor of claim 1, wherein the light sensing component comprises:
a metal layer, electrically connected to the source follower;
a transparent metal layer, electrically connected to the select line; and
a silicon rich oxide layer, formed between the metal layer and the transparent metal layer.

5. A method for detecting the luminance variation by using an image sensor, the image sensor comprising a light sensing component having a first end and a second end electrically connected to a select line; a diode having a first end electrically connected to a control line, and a second end electrically connected to the first end of the light sensing component; a source follower having input end electrically connected to the first end of the light sensing component, and an output end electrically connected to an output line; and a current source comprising a transistor having a first end electrically connected to the output line, a control end electrically connected to a second control line, and a second end electrically connected to a reference voltage source; and a capacitor having a first end electrically connected to the output line and a second end electrically connected to the reference voltage source, the method comprising:

transmitting a high level voltage by the control line to turn on the diode, for resetting a voltage level of the light sensing component;

transmitting a low level voltage by the control line to turn off the diode so as to have the light sensing component generate a voltage drop; and transmitting the high level voltage by the select line for transmitting the voltage drop to the output line via the source follower.

* * * * *